(12) United States Patent
Umeda et al.

(10) Patent No.: US 10,910,292 B2
(45) Date of Patent: Feb. 2, 2021

(54) ELECTRONIC DEVICE AND CONNECTION BODY

(71) Applicant: SHINDENGEN ELECTRIC MANUFACTURING CO., LTD., Tokyo (JP)

(72) Inventors: Soichiro Umeda, Hanno (JP); Yuji Morinaga, Hanno (JP)

(73) Assignee: SHINDENGEN ELECTRIC MANUFACTURING CO., LTD., Hanno (JP)

( * ) Notice: Subject to any disclaimer, the term of this patent is extended or adjusted under 35 U.S.C. 154(b) by 0 days.

(21) Appl. No.: 16/470,953

(22) PCT Filed: Feb. 20, 2017

(86) PCT No.: PCT/JP2017/006028
§ 371 (c)(1),
(2) Date: Jun. 18, 2019

(87) PCT Pub. No.: WO2018/150557
PCT Pub. Date: Aug. 23, 2018

(65) Prior Publication Data
US 2019/0378782 A1    Dec. 12, 2019

(51) Int. Cl.
*H01L 23/00* (2006.01)
*H01L 23/495* (2006.01)
(Continued)

(52) U.S. Cl.
CPC .......... *H01L 23/4828* (2013.01); *H01L 23/31* (2013.01); *H01L 23/49513* (2013.01);
(Continued)

(58) Field of Classification Search
CPC ................................................. H01L 23/49513
(Continued)

(56) References Cited

U.S. PATENT DOCUMENTS

| 5,001,545 A    | 3/1991  | Kalfus et al. |
| 7,285,849 B2 * | 10/2007 | Cruz ..................... H01L 21/568 |
|                |         | 257/690 |

(Continued)

FOREIGN PATENT DOCUMENTS

| EP | 0358077 A2  | 3/1990  |
| JP | 563170961 U | 11/1988 |

(Continued)

OTHER PUBLICATIONS

International Search Report for PCT/JP2017/006028, dated Apr. 18, 2017, and its English translation provided by WIPO.

(Continued)

*Primary Examiner* — David Vu
*Assistant Examiner* — Brandon C Fox
(74) *Attorney, Agent, or Firm* — Ladas & Parry, LLP

(57) ABSTRACT

An electronic device has a sealing part 90, an electronic element 95 provided in the sealing part 90 and a connection body 50 having a head part 40 connected to a front surface of the electronic element 95 via a conductive adhesive 75. The head part 40 has a second projection protruding 42 toward the electronic element 95 and a first projection 41 protruding from the second projection 42 toward the electronic element 95.

6 Claims, 17 Drawing Sheets

(51) Int. Cl.
*H01L 23/482* (2006.01)
*H01L 23/31* (2006.01)

(52) U.S. Cl.
CPC .. *H01L 23/49541* (2013.01); *H01L 23/49555* (2013.01); *H01L 24/06* (2013.01); *H01L 24/16* (2013.01); *H01L 24/32* (2013.01); *H01L 24/48* (2013.01); *H01L 2224/0603* (2013.01); *H01L 2224/48091* (2013.01); *H01L 2224/48247* (2013.01)

(58) Field of Classification Search
USPC .................................................. 257/676, 783
See application file for complete search history.

(56) References Cited

U.S. PATENT DOCUMENTS

| | | | |
|---|---|---|---|
| 9,111,922 B2* | 8/2015 | Andou | ................ H01L 21/4842 |
| 2007/0090463 A1 | 4/2007 | Xiaochun | |
| 2012/0074516 A1 | 3/2012 | Yamaguchi et al. | |
| 2012/0104584 A1* | 5/2012 | Chen | ................ H01L 23/49548 |
| | | | 257/676 |
| 2013/0241047 A1 | 9/2013 | Omae et al. | |
| 2017/0025331 A1 | 1/2017 | Kamiyama et al. | |
| 2018/0174951 A1* | 6/2018 | Fan | .................... H01L 23/3114 |

FOREIGN PATENT DOCUMENTS

| | | | | |
|---|---|---|---|---|
| JP | H02126659 A | | 5/1990 | |
| JP | 10294473 A | * | 11/1998 | ............ H01L 24/40 |
| JP | H10294473 A | | 11/1998 | |
| JP | 2010056378 A | | 3/2010 | |
| JP | 2012074543 A | | 4/2012 | |
| JP | 2015012065 A | | 1/2015 | |
| WO | 2012127696 A1 | | 9/2012 | |
| WO | 2016084483 A1 | | 6/2016 | |

OTHER PUBLICATIONS

Written Opinion for PCT/JP2017/006028, dated Apr. 18, 2017, and its English translation provided by Google Translate.
International Preliminary Examination Report (Chapter II) for PCT/JP2017/006028, dated Jan. 16, 2018, and its English translation provided by Google Translate.
Extended European Search Report from EP No. 17896507.5, dated Jul. 28, 2020.

* cited by examiner

ELECTRONIC DEVICE AND CONNECTION BODY

CROSS-REFERENCE TO RELATED APPLICATION

The present application is the U.S. national phase of PCT Application PCT/JP2017/006028 filed on Feb. 20, 2017, the disclosure of which is incorporated herein by reference in its entirety.

TECHNICAL FIELD

The present invention relates to an electronic device and a connection body.

BACKGROUND ART

Conventionally, it has been known that a semiconductor element is placed on a conductor layer of a substrate, and a front surface of the semiconductor element and a terminal are connected to each other with a connector via a conductive adhesive such as solder (JP 2015-12065 A). Since the solder placed between the connector and the front surface of the semiconductor element tends to have a crack at a peripheral edge, it is preferable to increase a thickness of the peripheral edge. On the other hand, necessity of increasing a thickness of the solder is not very high at an area other than the peripheral edge.

Further, demand for flowing a large capacity of current into a semiconductor device is not small, which may increase a size of the semiconductor element or the connector. When a large semiconductor element or connector is mounted, a thickness of the conductive adhesive such as solder is required to be increased in order to secure reliability tolerance due to temperature change or the like. For that purpose, it is necessary to increase a coating amount of the conductive adhesive such as solder. On the other hand, an increase in the coating amount of the conductive adhesive causes higher risk of a solder bridge between electrodes on the front surface of the semiconductor element.

SUMMARY OF INVENTION

Technical Problem

In view of the above, it is an object of the present invention to provide a highly reliable electronic device that secures a thickness of a conductive adhesive while using an appropriate amount of the conductive adhesive, and to provide a connection body that can be used for such an electronic device.

Solution to Problem

An electronic device according to an example of the present invention comprises:
a sealing part;
an electronic element provided in the sealing part; and
a connection body having a head part connected to a front surface of the electronic element via a conductive adhesive, wherein
the head part has a second projection protruding toward the electronic element and a first projection protruding from the second projection toward the electronic element.
In the electronic device according to an example of the present invention,
the connection body may be a connector having a base end part.
In the electronic device according to an example of the present invention,
the base end part may have a supporting surface and a recess that is provided at a peripheral edge of the supporting surface.
The electronic device, according to an example of the present invention, may further comprise
a first terminal protruding outward from a side of the sealing part, wherein
the first terminal may be integrally formed with the head part.
In the electronic device according to an example of the present invention,
the second projection may be positioned at a place including a center in a width direction of the head part.
In the electronic device according to an example of the present invention,
the only one first projection may be provided and is positioned at a center position of the second projection.
In the electronic device according to an example of the present invention,
the first projection may have a linear part located on a base side of the first projection and having a linear vertical cross-sectional shape, and a hemispherical shape part positioned on a tip end side of the linear part and having a hemispherical or circular-arc vertical cross-sectional shape.
A connection body according to an example of the present invention is a connection body used for an electronic device having a sealing part and an electronic element provided in the sealing part, the connection body comprising:
a head part connected to a front surface of the electronic element via a conductive adhesive, wherein
the head part has a second projection protruding toward the electronic element and a first projection protruding from the second projection toward the electronic element.

Advantageous Effects of Invention

According to the present invention, since the configuration has the second projection and the first projection, it is possible to increase a thickness of the conductive adhesive such as solder to a certain extent at an area not provided with the first projection, and to further increase the thickness of the conductive adhesive at an area not provided with the second projection and the first projection. Further, since the configuration has the second projection and the first projection, usage of the conductive adhesive can be reduced. Furthermore, the second projection can also be used to secure a width of a current path.

BRIEF DESCRIPTION OF DRAWINGS

FIG. 5 is a side view showing Example 2 of a relationship of the head part, the avoidance part, the first main terminal, the front surface sensing terminal, and the like.

DESCRIPTION OF EMBODIMENTS

First Embodiment

<<Configuration>>

Figure 1:
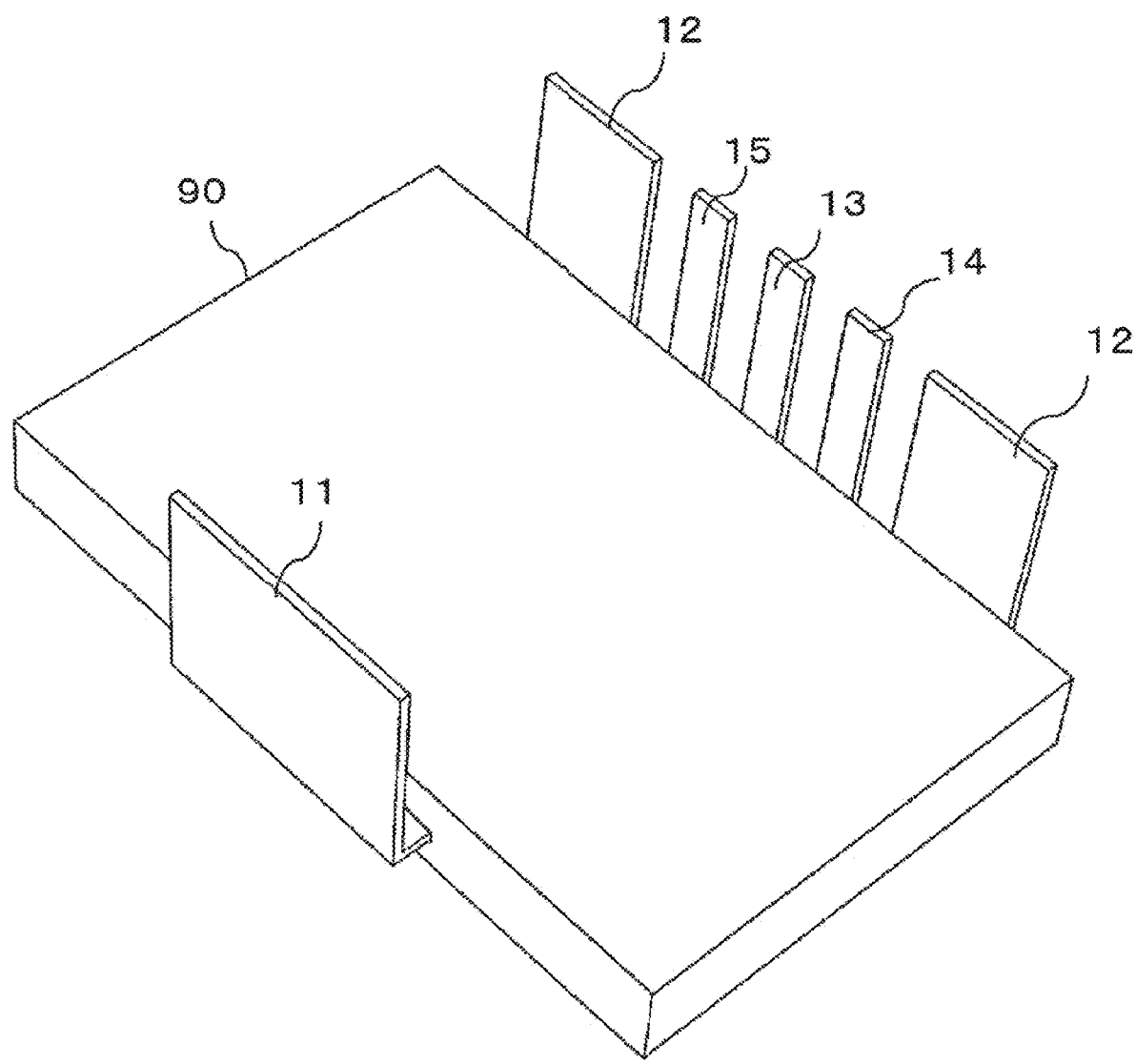
FIG. 1 is a perspective view of a semiconductor device according to a first embodiment of the present invention.
Figure 2:
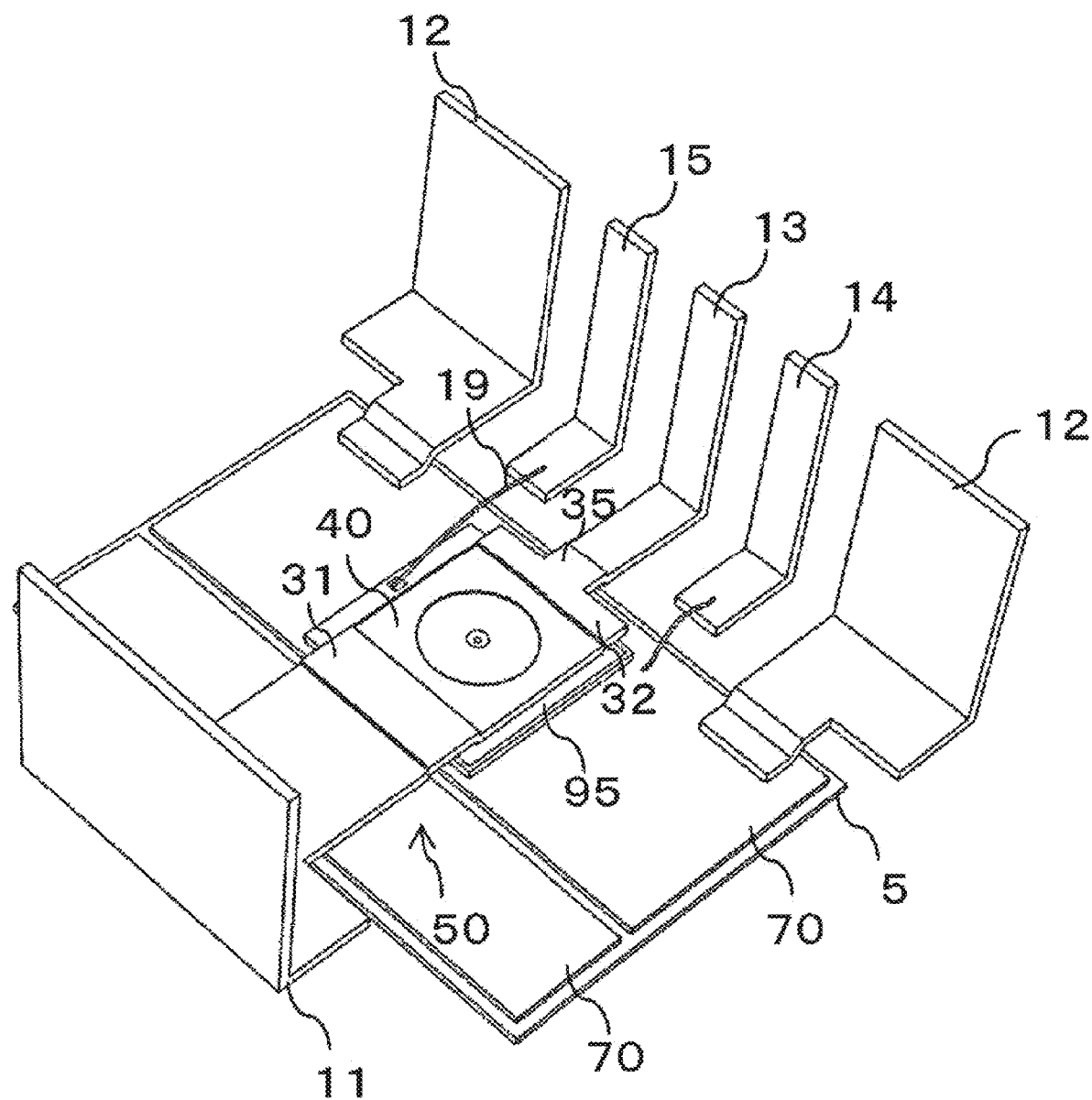
FIG. 2 is a perspective view showing an aspect in which a sealing part is removed in the semiconductor device according to the first embodiment of the present invention.
Figure 7:
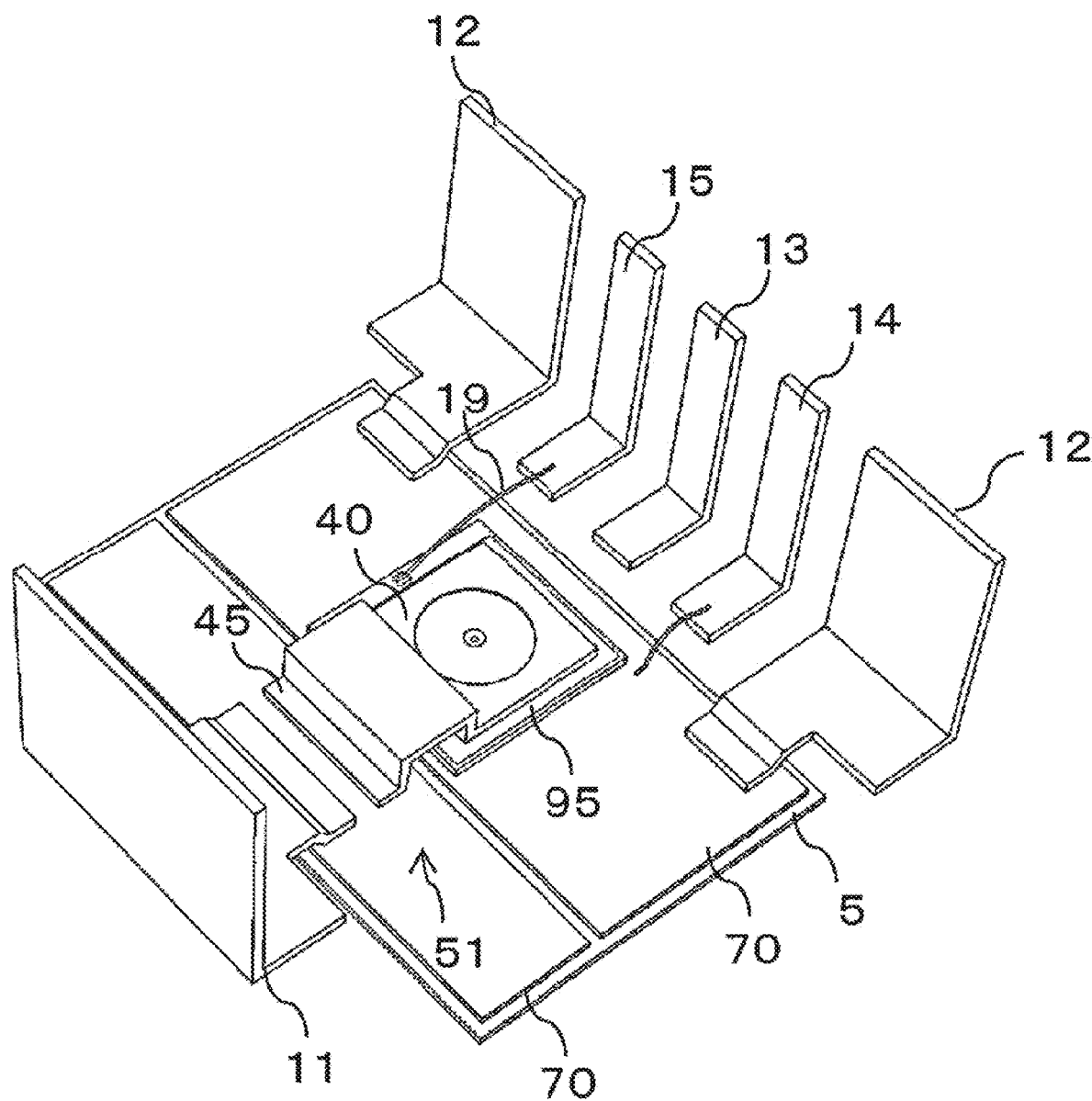
FIG. 7 is a perspective view corresponding to FIG. 2 and showing an aspect in which a connector is used as a connection body.

As shown in FIG. 2, a semiconductor device as an example of an electronic device of this embodiment may have a substrate 5 made of an insulating material for example, and a conductor layer 70 provided on the substrate 5 and made of copper or the like. A back surface of the substrate 5 may be provided with a heat radiating plate 79 (see FIG. 9) made of copper or the like. As shown in FIG. 2, the semiconductor device may have a sealing part 90 (see FIG. 1) made of sealing resin or the like, a semiconductor element 95 provided in the sealing part 90 and a connection body 50 having a head part 40 connected to a front surface of the semiconductor element 95 via a conductive adhesive 75 such as solder (see FIG. 9). In the present embodiment, as shown in FIG. 7, the connection body 50 may be a connector 51 having the head part 40 and a base end part 45 that is connected to a first main terminal 11 via the conductor layer 70. In an aspect shown in FIG. 7, the front surface sensing terminal 13 is electrically connected to the base end part 45 by a wire or the like (not shown). The semiconductor device may have the first main terminal 11 protruding outward from the sealing part 90, and a second main terminal 12 protruding outward from the sealing part 90.

In the present embodiment, explanation will be made using a semiconductor device as an electronic device, and the semiconductor element 95 as an electronic element. However, the present invention is not limited to this, and not particularly required to be a "semiconductor".

Figure 3:
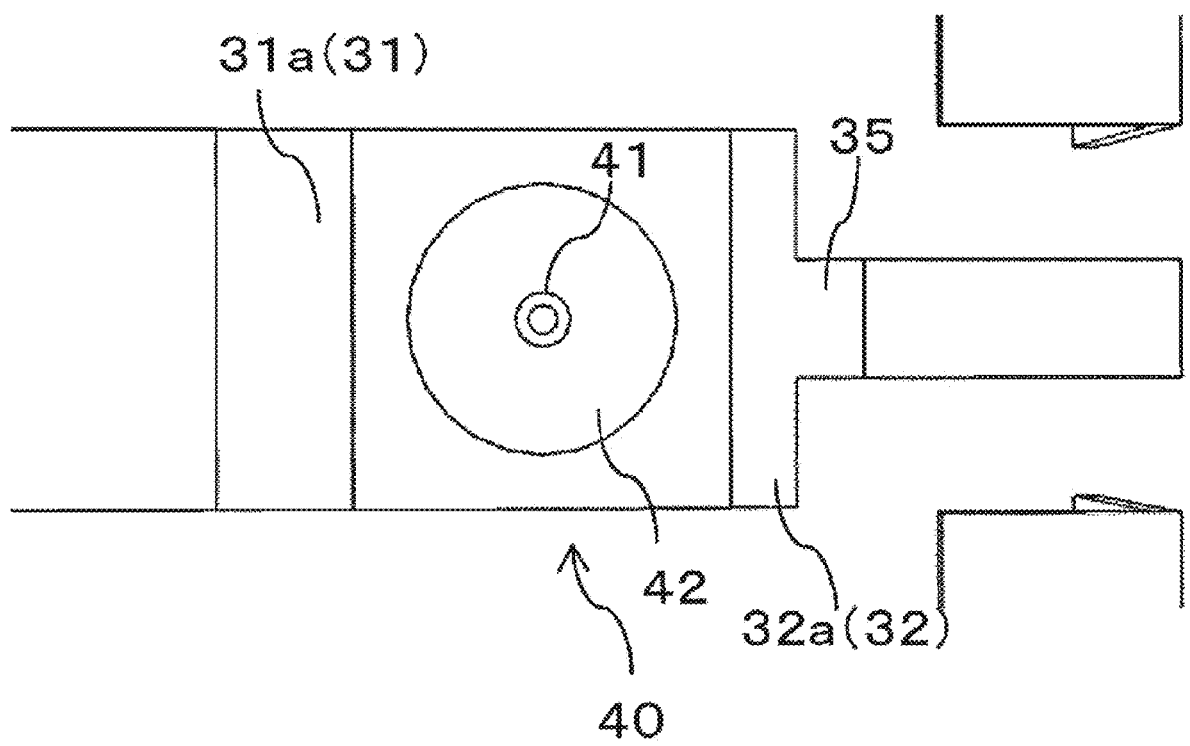
FIG. 3 is a bottom view showing a relationship of a head part, an avoidance part, and the like that are used in the first embodiment of the present invention.
Figure 4:
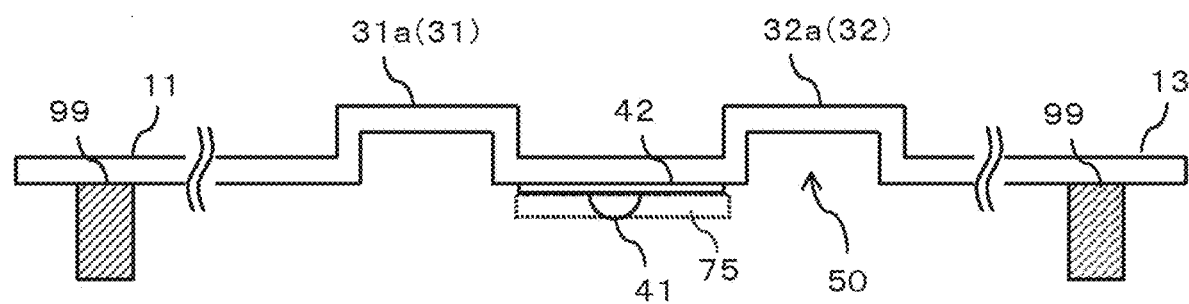
FIG. 4 is a side view showing Example 1 of a relationship of the head part, the avoidance part, a first main terminal, a front surface sensing terminal, and the like that are used in the first embodiment of the present invention.
Figure 8:
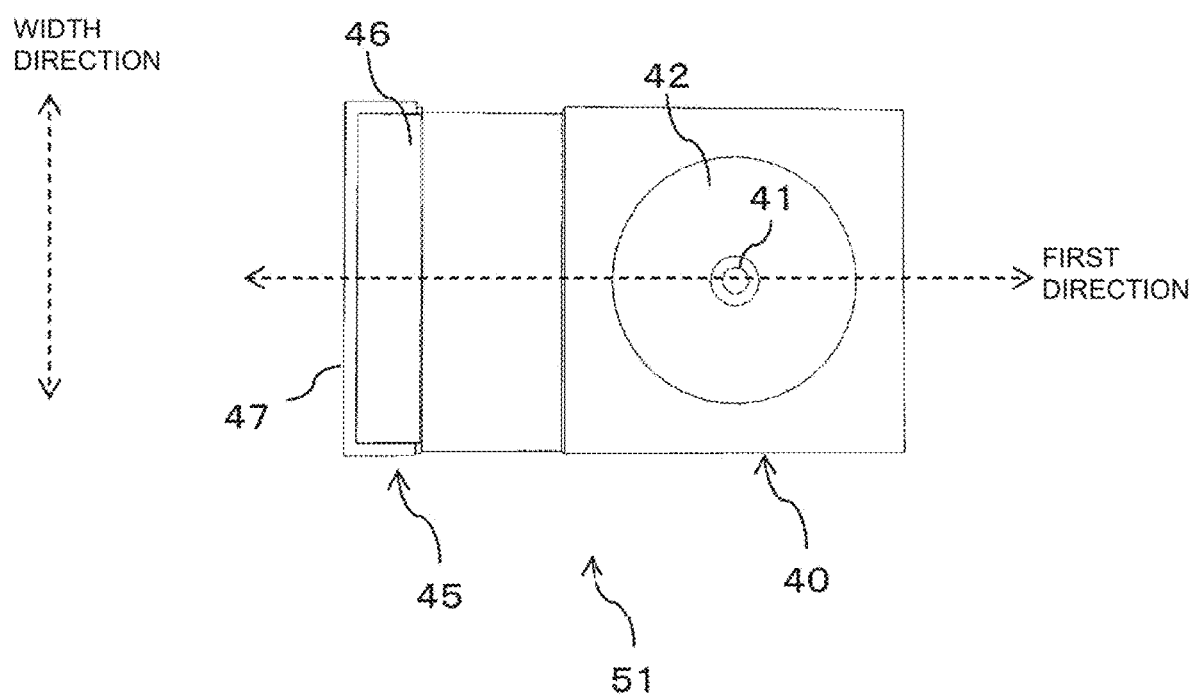
FIG. 8 is a bottom view showing the connector used in the first embodiment of the present invention.
Figure 11:
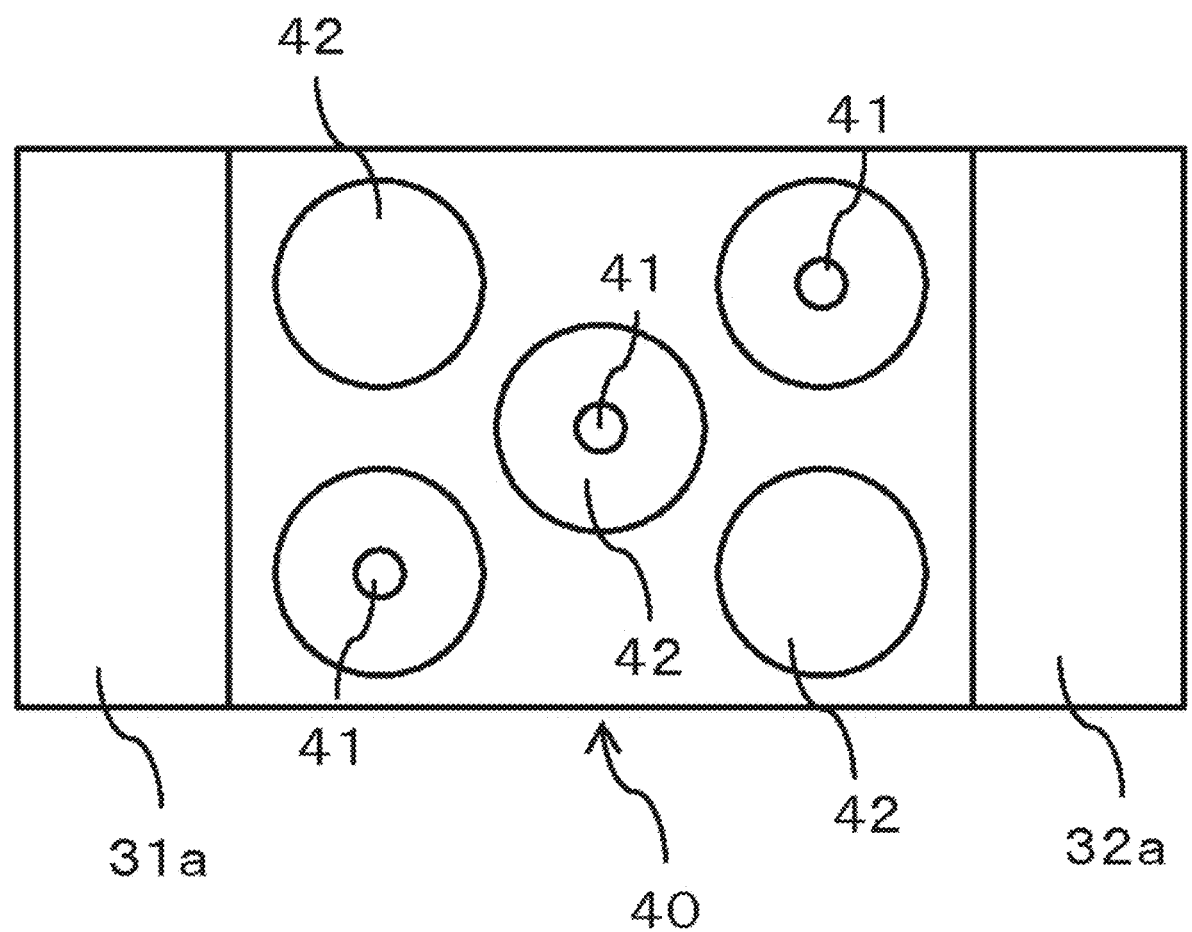
FIG. 11 is a bottom view showing one modification of the head part used in the first embodiment of the present invention.
Figure 12:
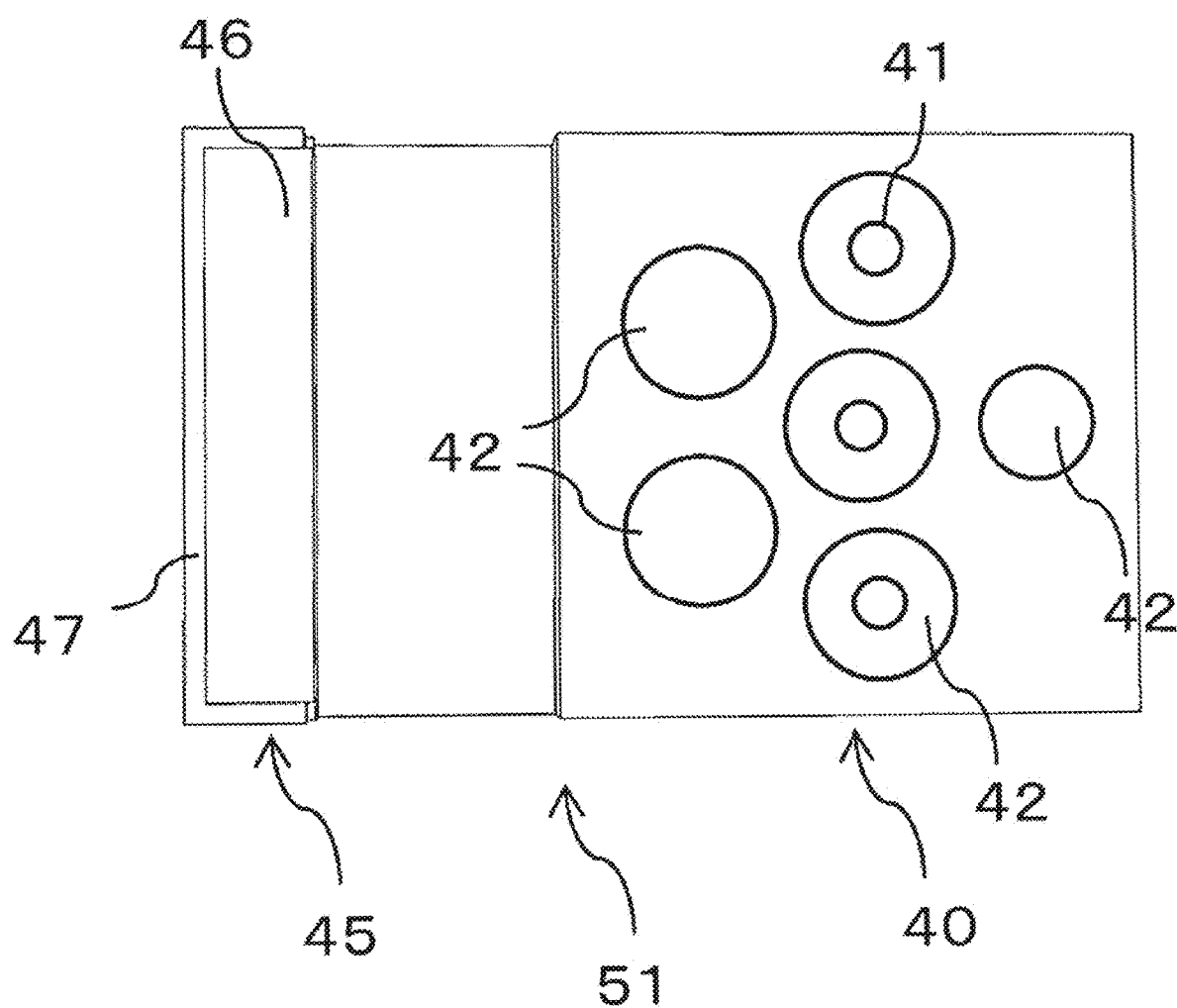
FIG. 12 is a bottom view showing another modification of the head part used in the first embodiment of the present invention.

As shown in FIGS. 3, 4, and 8, the head part 40 may have a second projection 42 protruding toward the semiconductor element 95, and a first projection 41 protruding from the second projection 42 toward the semiconductor element 95. While only one each of the first projection 41 and the second projection 42 are provided in this aspect, a plurality of the first projections 41 and a plurality of the second projections 42 may be provided as shown in FIGS. 11 and 12. Further, as shown in FIGS. 11 and 12, an aspect may be such that a part of a plurality of the second projections 42 is not provided with the first projection 41.

When only one first projection 41 is provided, this first projection 41 may be positioned at a center position of the second projection 42 (see FIGS. 3 and 8). The first projection 41 being positioned at the center position of the second projection 42 means that the first projection 41 is positioned at a center of the second projection 42, in a first direction and a width direction orthogonal to the first direction.

In the aspect shown in FIG. 2, the second main terminal 12 is connected to the conductor layer 70, and the second main terminal 12 is connected to a back surface of the semiconductor element 95 via the conductor layer 70. On a peripheral edge of a connecting point of the second main terminal 12 with the conductor layer 70, a resist (not shown) may be provided to prevent a conductive adhesive such as solder from flowing out. The back surface of the semiconductor element 95 and the conductor layer 70 may be connected via a conductive adhesive such as solder.

In the semiconductor element 95 shown in FIG. 2, the front surface is electrically connected to the first main terminal 11, and the back surface is electrically connected to the second main terminal 12. In the present embodiment, there are provided a sensing terminal 13 on the front surface side (hereinafter referred to as a "front surface sensing terminal 13") projecting outward from the sealing part 90 and used for sensing on a source side, and a connecting part 35 formed integrally with the head part 40 and electrically connected to the front surface sensing terminal 13. In the present embodiment, explanation will be made while the first main terminal 11 through which a main current flows is used as a first terminal, and the front surface sensing terminal 13 through which a main current flows is used as a second terminal. However, the present invention is not limited to this. It is also possible to adopt an aspect in which the main current does not flow to the first terminal, or an aspect in which the second terminal is not used for sensing. Further, in the present embodiment, "coupled" includes an aspect of being "integrated".

Figure 9:
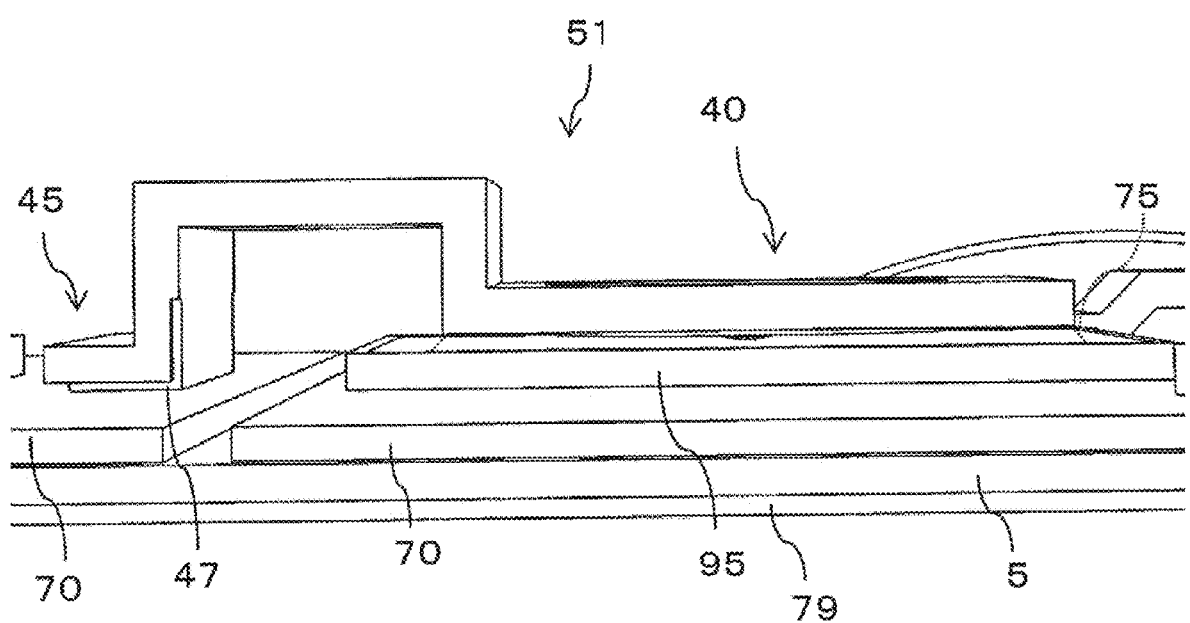
FIG. 9 is a side view in which a vicinity of the connector is enlarged in FIG. 7.
Figure 10:
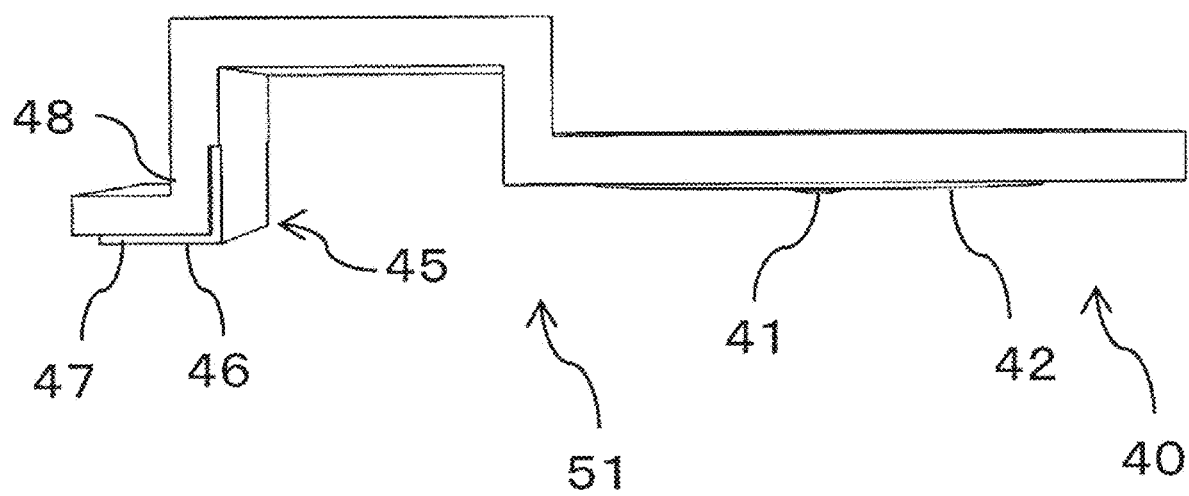
FIG. 10 is a side view showing the connector used in the first embodiment of the present invention.

In an aspect in which the connector 51 is used, the base end part 45 may have a supporting surface 46 and a recess 47 that is provided at a peripheral edge of the supporting surface 46, as shown in FIGS. 8 to 10. The recess 47 may be provided to surround the entire supporting surface 46, or may be formed to continuously surround three sides of the supporting surface 46 on the base end side, as shown in FIG. 8. Additionally, the recess 47 may be formed to surround the supporting surface 46 intermittently, not continuously. Further, the base end part 45 may have a bent part 48 bent and extending toward the front surface side (an upper side in FIG. 9). The recess 47 may extend to the front surface side along the bent part 48 extending from the supporting surface 46 to the front surface side. When adopting an aspect in which the recess 47 extends toward the front surface side along the bent part 48 in this way, it is advantageous in that a conductive adhesive can be provided along the recess 47 provided to the bent part 48, and a fillet can be easily formed.

In an aspect in which the connector 51 is used, when a straight line connecting a center of the base end part 45 in a width direction (a vertical direction in FIG. 8) and a center of the head part 40 in the width direction is defined as a first direction (a horizontal direction in FIG. 8), a length of the supporting surface 46 along the first direction may be shorter than a length of the second projection 42 along the first direction (see FIG. 8).

The first projection 41 may be positioned at the center in the width direction of the head part 40.

The semiconductor element 95 may have a withstand voltage structure such as a guard ring. When the semiconductor element 95 has such a withstand voltage structure, as shown in FIGS. 2 to 6, there may be provided avoidance parts 31 and 32 that are integrally formed with the head part 40 and to avoid contact with the withstand voltage structure.

Figure 5:
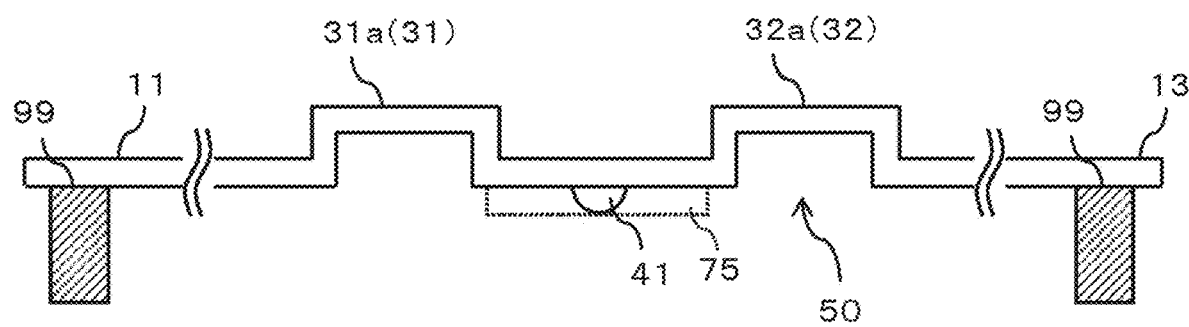
Figure 6:
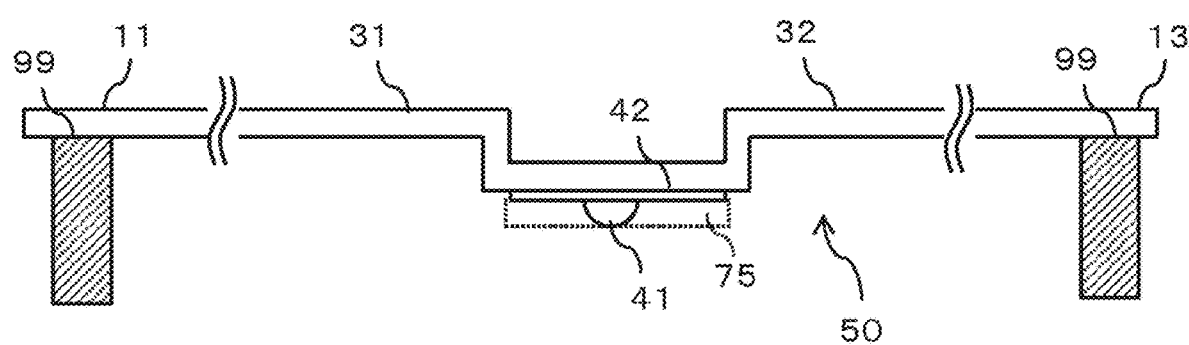
FIG. 6 is a side view showing Example 3 of a relationship of the head part, the avoidance part, the first main terminal, the front surface sensing terminal, and the like that are used in the first embodiment of the present invention.

As shown in FIGS. 2 to 6, the avoidance parts 31 and 32 may have a first avoidance part 31 provided between the first main terminal 11 and the head part 40, and a second avoidance part 32 provided between the front surface sensing terminal 13 and the head part 40. The first avoidance part 31 may be a first recess 31a recessed so as to be separated from the semiconductor element 95, and the second avoidance part 32 may be a second recess 32a recessed so as to be separated from the semiconductor element 95. Note that FIG. 6 shows an aspect in which a recess is not used.

The first main terminal 11 and the second main terminal 12 may be power terminals through which a large current flows. When the first main terminal 11 and the second main terminal 12 are such power terminals, since a current flowing through the connector 51 is large, a size of the connector 51 is increased. This causes the connector 51 to easily sink into the conductive adhesive 75.

Figure 15:
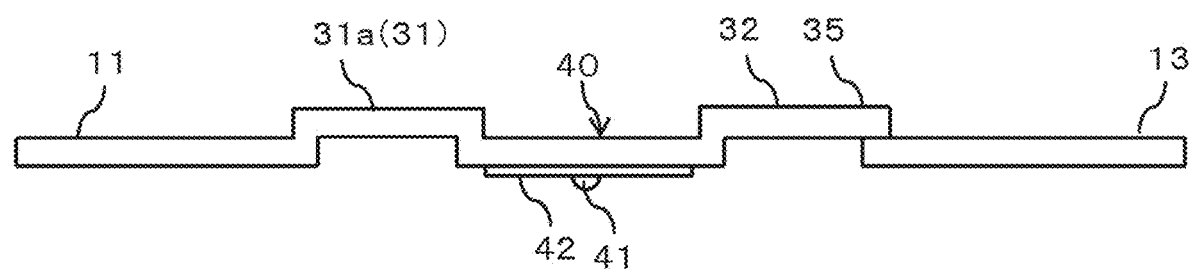
FIG. 15 is a side view showing an aspect in which a connecting part and the front surface sensing terminal are separated.

As shown in FIG. 2 and the like, the front surface sensing terminal 13 and the connecting part 35 may be integrally formed with the head part 40. However, the present invention is not limited to this, and for example, as shown in FIG. 15, the connecting part 35 and the front surface sensing terminal 13 may be formed separately while the connecting part 35 and the head part 40 are formed integrally. As an example, the back surface of the connecting part 35 may be electrically connected to the front surface of the front surface sensing terminal 13 via a conductive adhesive or the like. Further, the first main terminal 11 and the head part 40 may be integrally formed. In addition, the front surface sensing terminal 13 and the first main terminal 11 may be provided extending in an opposite direction from the head part 40.

In the aspect shown in FIG. 2, as an example, a width of the connecting part 35 is larger than a width of the front surface sensing terminal 13. Further, widths of the first avoidance part 31, the head part 40, and the second avoidance part 32 are larger than the width of the connecting part 35, while widths of the first main terminal 11 and the second main terminal 12 are larger than the widths of the first avoidance part 31, the head part 40, and the second avoidance part 32.

In an aspect shown in FIG. 1, the second main terminal 12, the front surface sensing terminal 13, a back surface sensing terminal 14, and a control terminal 15 protrude from one side surface of the sealing part 90 from outside, while the first main terminal 11 protrudes outward from another side surface of the sealing part 90. The first main terminal 11, the second main terminal 12, the front surface sensing terminal 13, the back surface sensing terminal 14, and the control terminal 15 are bent toward the front surface side, and connected to a control substrate 5 provided on the front surface side. This control substrate 5 is used for controlling the semiconductor element 95.

A structure inside the sealing part 90 of the semiconductor device may be line symmetrical. As an example, each of the first main terminal 11, the second main terminal 12, the front surface sensing terminal 13, the back surface sensing terminal 14, the control terminal 15, and the conductor layer 70 may be arranged to be line symmetrical with respect to any given straight line. In addition, a wire 19 is also shown in FIG. 2.

Figure 14:
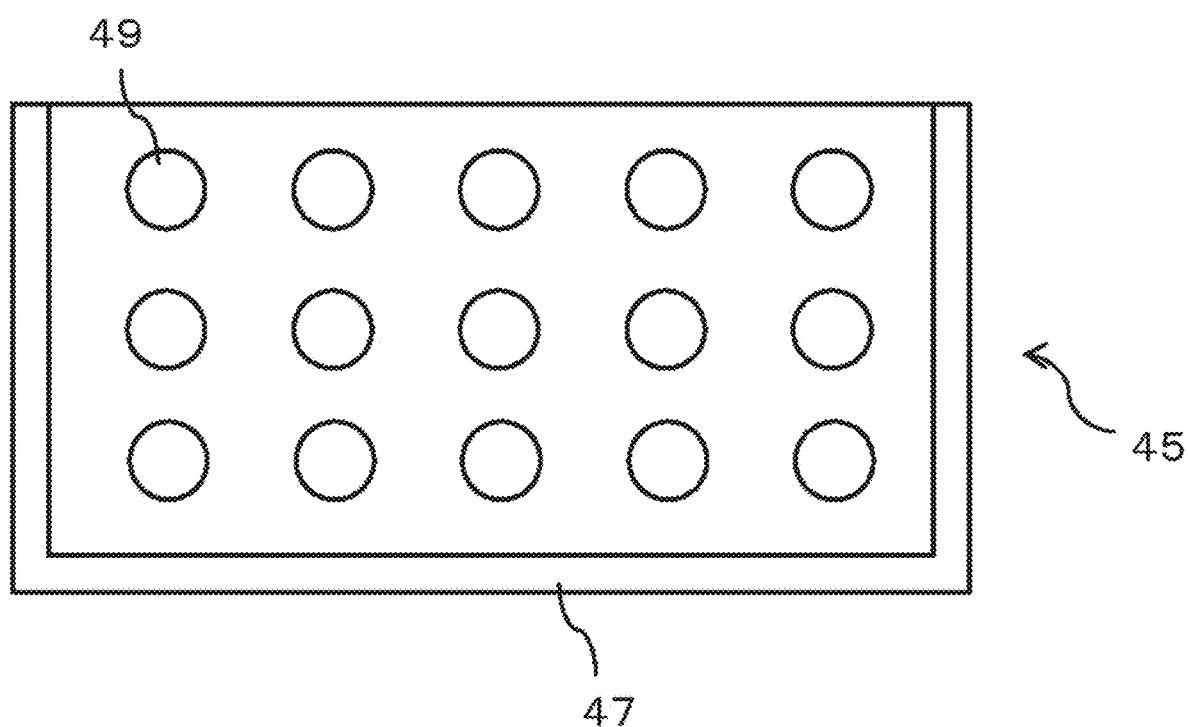
FIG. 14 is a bottom view showing a base end part of the connector used in a modification of the first embodiment of the present invention.

In an aspect in which the connector 51 is used, as shown in FIG. 14, the aspect may be such that the base end part 45 of the connector 51 has a plurality of protrusions 49 in contact with the conductor layer 70.

Operation and Effect

Next, operations and effects according to the present embodiment having the above-described configuration will be described.

Figure 13:
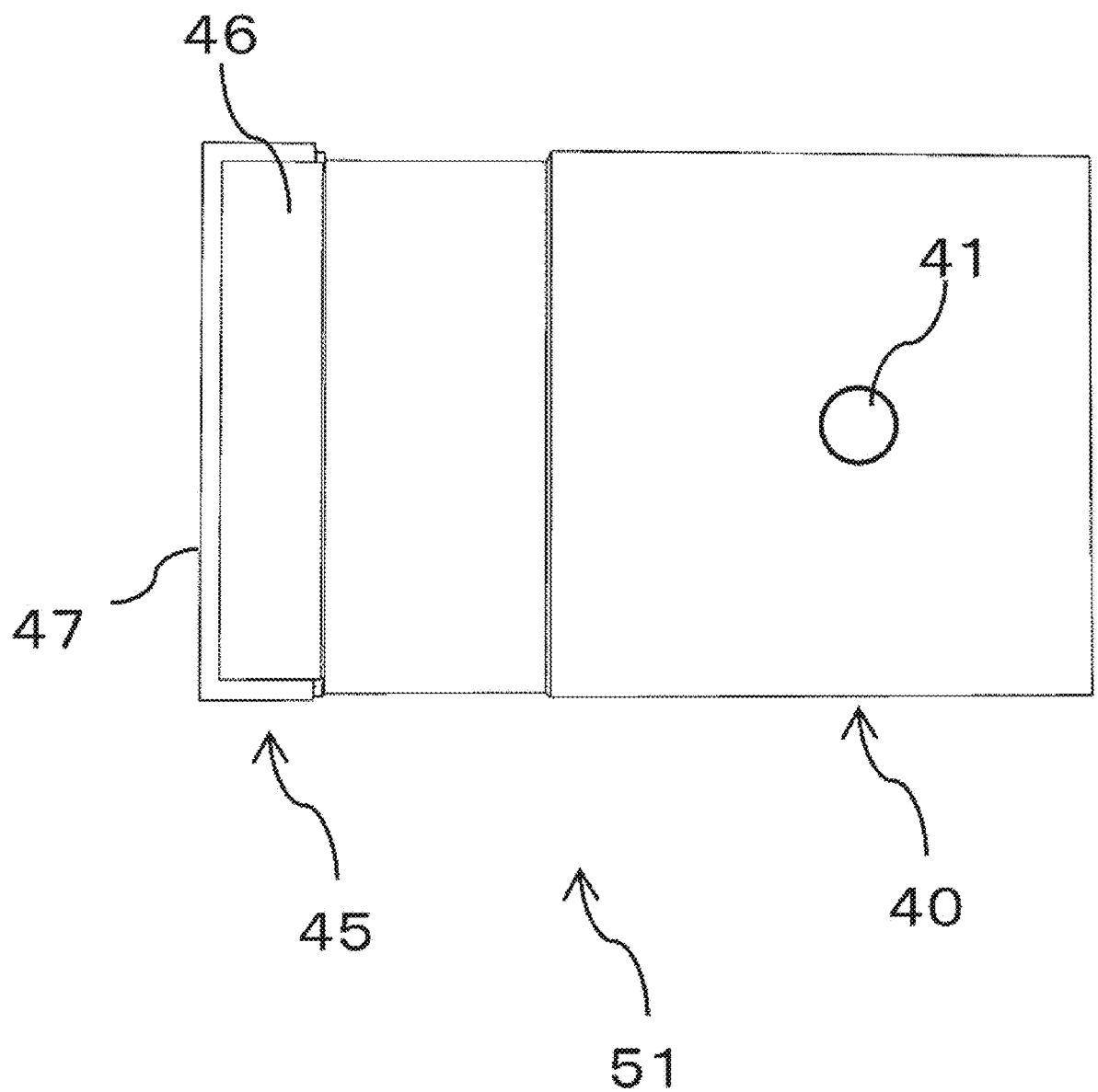
FIG. 13 is a bottom view showing a modification of the connector.

According to the present embodiment, as shown in FIGS. 2, 8, and the like, since the configuration has the second projection 42 and the first projection 41, it is possible to increase a thickness of the conductive adhesive 75 such as solder to a certain extent at an area not provided with the first projection 41, and to further increase the thickness of the conductive adhesive 75 at an area not provided with the second projection 42 and the first projection 41. Further, since the configuration has the second projection 42 and the first projection 41, usage of the conductive adhesive 75 can be reduced. Furthermore, the second projection 42 can also be used to secure a width of a current path. In particular, when the head part 40 sinks into the conductive adhesive 75 due to a weight of the connector 51, and the first projection 41 and the front surface of the semiconductor element 95 are in contact with each other, setting widths (heights) of the first projection 41 and the second projection 42 to an appropriate value allows providing of the conductive adhesive 75 having an appropriate thickness, between the head part 40 and the front surfaces of the semiconductor element 95. Note that FIGS. 5 and 13 show an aspect in which the second projection 42 is not provided.

Further, there is a restriction on an amount of the conductive adhesive 75 that can be applied to the front surface of the semiconductor element 95, and a size of the head part 40 that can be placed on the front surface of the semiconductor element 95. In this regard, by providing the second projection 42 having a size (in an in-plane direction) of an only necessary contact area with the conductive adhesive 75, an appropriate contact area with the conductive adhesive 75 can be secured, and the amount of the conductive adhesive 75 can be made appropriate.

Further, in an aspect the connector 51 is used, as shown in FIG. 8, when the base end part 45 has the supporting surface 46, even when the head part 40 sinks into the conductive adhesive 75 due to the weight of the connector 51, the base end part 45 can contact with the conductor layer 70 with the supporting surface 46, or float in balance on the conductive adhesive 75 (before curing). When the supporting surface 46 contacts with the conductor layer 70, it is possible to more reliably prevent loss of balance of the connector 51. On the other hand, when the supporting surface 46 is floating on the conductive adhesive 75, the base end part 45 and the conductor layer 70 can be bonded more reliably when the conductive adhesive 75 is cured.

In an aspect in which the base end part 45 is connected to the conductor layer 70 via the conductive adhesive 75 such as solder, when adopting an aspect in which the base end part 45 has the supporting surface 46 and the recess 47 that is provided on the peripheral edge of the supporting surface 46, the conductive adhesive 75 can be inserted into the recess 47, and a fillet (e.g., a solder fillet) can be easily formed by the conductive adhesive 75. Therefore, cracks and the like can be prevented after the amount of the conductive adhesive 75 becomes insufficient and the conductive adhesive 75 is cured. In particular, when the connector 51 is heavy to an extent where the supporting surface 46 contacts with the conductor layer 70, providing such the recess 47 is advantageous in that the base end part 45 and the conductor layer 70 can be bonded by the conductive adhesive 75.

By adopting an aspect in which the length of the supporting surface 46 along the first direction is shorter than the length of the second projection 42 along the first direction, a size of the base end part 45 can be reduced (see FIG. 8). In addition, by making the length along the first direction shorter than that of the second projection 42, but longer than that of the first projection 41, the supporting surface 46 can prevent loss of balance.

Adopting an aspect in which the first projection 41 is positioned at the center in the width direction of the head part 40 can prevent inclination of the head part 40 in the width direction. In particular, in an aspect in which the head part 40 sinks into the conductive adhesive 75 due to the weight of the connector 51, and the first projection 41 and the front surface of the semiconductor element 95 are in contact with each other, the head part 40 may incline in the width direction with the first projection 41 as the center. In this regard, adopting this aspect can reduce possibility of inclination of the head part 40 in the width direction.

When adopting an aspect in which only one first projection 41 is provided, it is advantageous in that the conductive adhesive 75 can be positioned at an area not provided with the first projection 41, and the conductive adhesive 75 can more reliably fix the head part 40 to the semiconductor element 95.

In addition, when adopting an aspect in which the first projection 41 is positioned at the center position of the second projection 42, it is possible to position the conductive adhesive 75 in a well-balanced manner around the first projection 41, and furthermore, it is possible to prevent the head part 40 from being inclined with respect to the front surface of the semiconductor element 95.

In a case where the semiconductor element 95 has a withstand voltage structure, when there are provided the avoidance parts 31 and 32 that are integrally formed with the head part 40 and to avoid contact with the withstand voltage structure as shown in FIGS. 4 to 6 and the like, it is possible to prevent electrical contact in advance between the withstand voltage structure of the semiconductor element 95 and the connection body 50.

The first main terminal 11 and the front surface sensing terminal 13 may be integrally formed with the head part 40, or the first main terminal 11 and the second main terminal 12 may be integrally formed with the head part 40. In particular, when adopting an aspect in which the first main terminal 11 as the first terminal is integrally formed with the front surface sensing terminal 13 as the second terminal on an extended line connecting the first terminal and the head part 40, the first main terminal 11 and the front surface sensing terminal 13 can be utilized as a jig receiver to receive a jig 99 (see FIGS. 4 to 6), at a time of manufacturing. Therefore, it is possible to prevent the head part 40 from being inclined with respect to the front surface of the semiconductor element 95. However, the present invention is not limited thereto, and it is only necessary that the front surface sensing terminal 13 and the connecting part 35 extend in a different direction from that of the first main terminal 11 as viewed from the head part 40. For example, the front surface sensing terminal 13 and the connecting part 35, and the first main terminal 11 may extend so as to form 90 degrees or an angle greater than 90 degrees (obtuse angle).

Second Embodiment

Hereinafter, a second embodiment of the present invention will be described.

Figure 16:
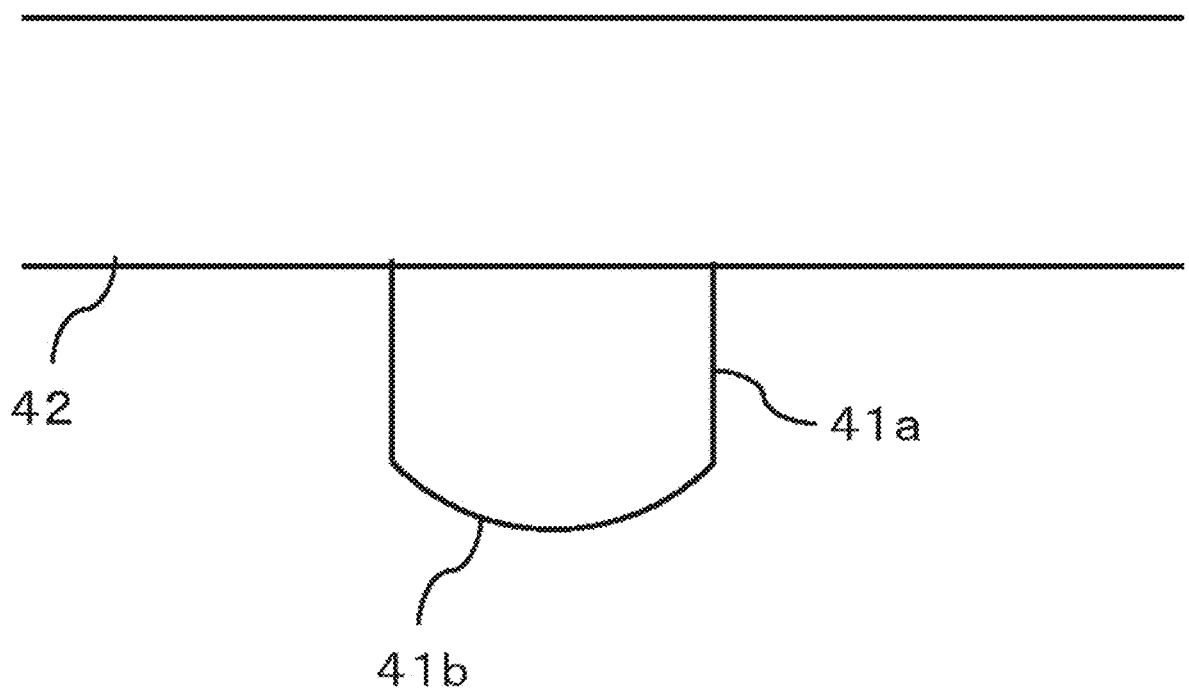
FIG. 16 is a side view showing one aspect of a first projection used in a second embodiment of the present invention.

Explanation has been made using the aspect in which the first projection 41 has a hemispherical shape in the first embodiment. In the second embodiment, as shown in FIGS. 16 and 17, an aspect is such that a first projection 41 has a linear part 41a located on a base side of the first projection 41 and having a linear vertical cross-sectional shape, and a hemispherical shape part 41b positioned on a tip end side of the linear part 41a and having a hemispherical or circular-arc vertical cross-sectional shape.

Other configurations are similar to those in the first embodiment. In the second embodiment, same or similar members and the like to the first embodiment are denoted by the same reference numerals, and description thereof is omitted. This embodiment can also provide an effect similar to the effect to be realized by the first embodiment.

In the present embodiment, since the first projection 41 has the linear part 41a located on the base side of the first projection 41 and having the linear vertical cross-sectional shape, and the hemispherical shape part 41b positioned on the tip end side of the linear part 41a, a diameter of the hemispherical shape part 41b can be reduced. Therefore, even when a head part 40 sinks into a conductive adhesive 75 and the first projection 41 comes into contact with a front surface of a semiconductor element 95, the first projection 41 and the front surface of the semiconductor element 95 can be brought into contact with each other with a smaller area (point). This can increase an amount of the conductive adhesive 75 located between the head part 40 and the front surface of the semiconductor element 95, enabling prevention in advance of occurrence of problems such as cracking in the conductive adhesive 75 upon curing.

Figure 17:
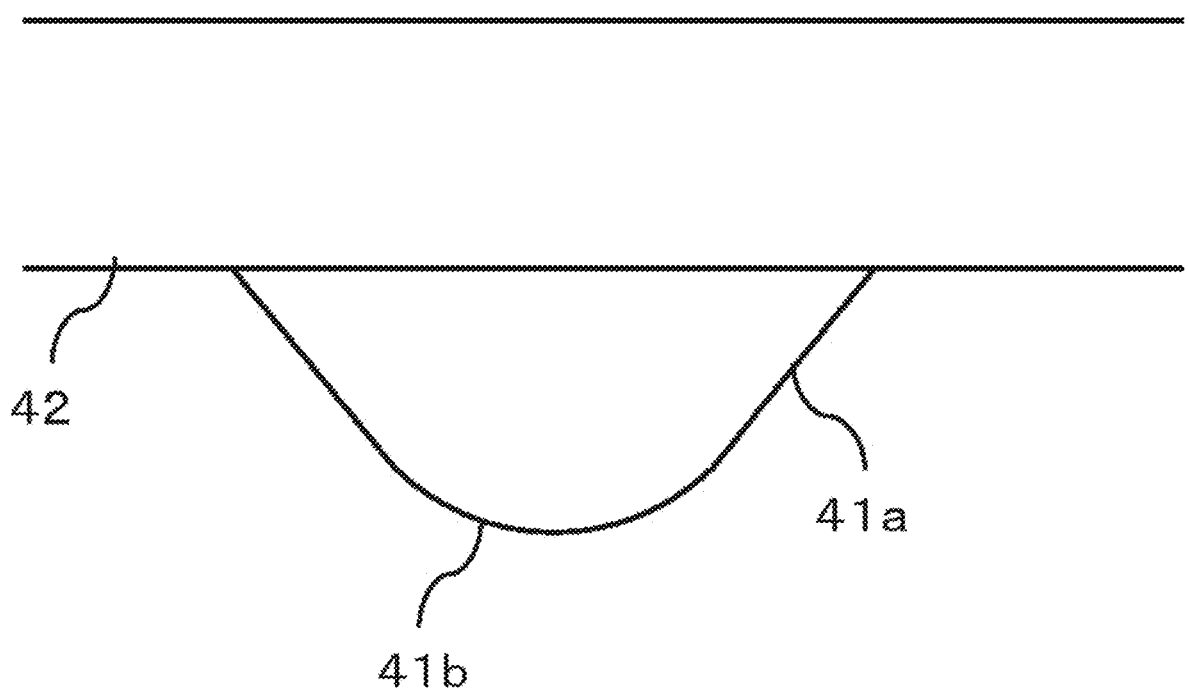
FIG. 17 is a side view showing another aspect of the first projection used in the second embodiment of the present invention.

As shown in FIG. 17, when adopting an aspect having a tapered shape as the linear part 41a, in which a width decreases toward a tip end, it is possible to increase the conductive adhesive 75 on the tip end side. Therefore, it is possible to prevent in advance of occurrence of problems such as cracking in the conductive adhesive 75 upon curing, on the tip side close to the semiconductor element 95. Further, since the amount of the conductive adhesive 75 can be gradually increased toward the tip end side, the conductive adhesive 75 can be evenly and reliably positioned around the first projection 41. Therefore, when the connector 51 is adopted, possibility of inclination of the head part 40 can be reduced. Note that the linear part 41a has a cylindrical shape in an aspect shown in FIG. 16.

Lastly, the description of each embodiment, the description of the modification, and the disclosure of the drawings described above are merely examples for explaining the invention described in the claims, and the invention described in the claims is not limited by the description of the embodiment or the disclosure of the drawings described above. In addition, the description of the claims at the original application is merely an example, and the description of the claims can be appropriately changed based on the description of the specification, the drawings, and the like.

REFERENCE SIGNS LIST

11 First terminal (first main terminal)
13 Second terminal (front surface sensing terminal)
40 Head part
41 First projection
41a Linear part
41b Hemispherical shape part
42 Second projection
45 Base end part
46 Supporting surface
47 Recess
50 Connection body
51 Connector
90 Sealing part
95 Semiconductor element (electronic element)

The invention claimed is:

1. An electronic device comprising:
a substrate;
a conductor layer provided on the substrate;
an electronic element provided on the conductor layer;
a connection body having a head part connected to a front surface of the electronic element via a conductive adhesive;
a sealing part which seals the conductor layer, the electronic element and the head part;
wherein the head part has a protrusion part protruding toward a side of the electronic element from a facing surface facing the front surface of the electronic element, and a projection part protruding from the protrusion part toward the side of the electronic element, and
in a state where the projection part comes into point contact with the front surface of the electronic element, and the conductive adhesive is bonded to the protrusion part and is bonded to the facing surface of the head part around the protrusion part, the head part is connected to the front surface of the electronic element.

2. The electronic device according to claim 1, wherein the connection body has a base end part connected to another conductor layer, which is different from the conductor layer provided on the substrate, via a conductive adhesive.

3. The electronic device according to claim 1, wherein the connection body has a base end part protruding outward from the sealing part.

4. The electronic device according to 1, wherein the only one projection part is provided and is positioned at a center in a width direction of the head part.

5. The electronic device according to claim 1, wherein the projection part has a columnar part protruding from the protrusion part toward the side of the electronic element and a hemispherical part provided at a tip of the columnar part.

6. A connection body used for an electronic device including a substrate, a conductor layer provided on the substrate, an electronic element provided on the conductor layer and a sealing part which seals the conductor layer and the electronic element,
the connection body connected to a front surface of the electronic element comprising a head part connected to the front surface of the electronic element via a conductive adhesive, wherein
the head part has a protrusion part protruding toward a side of the electronic element from a facing surface facing the front surface of the electronic element, and a projection part protruding from the protrusion part toward the side of the electronic element, and
in a state where the projection part comes into point contact with the front surface of the electronic element, and the conductive adhesive is bonded to the protrusion part and is bonded to the facing surface of the head part around the protrusion part, the head part is connected to the front surface of the electronic element.

* * * * *